United States Patent [19]

Burton et al.

[11] 4,415,414
[45] Nov. 15, 1983

[54] ETCHING OF OPTICAL SURFACES

[75] Inventors: Randolph H. Burton, Somerset; Paul A. Kohl; Frederick W. Ostermayer, Jr., both of Chatham, all of N.J.

[73] Assignee: Bell Telephone Laboratories, Incorporated, Murray Hill, N.J.

[21] Appl. No.: 416,473

[22] Filed: Sep. 10, 1982

[51] Int. Cl.³ .............................. C25F 3/12; C25F 3/14
[52] U.S. Cl. ............................. 204/129.3; 204/129.65; 204/129.75
[58] Field of Search ........... 204/129.3, 129.65, 129.75, 204/129.8

[56] References Cited

U.S. PATENT DOCUMENTS

| 3,041,258 | 6/1962 | Sikina | 204/129.75 |
| 3,728,236 | 4/1973 | Weller | 204/129.75 |
| 3,954,523 | 5/1976 | Magdo | 204/129.3 |
| 4,351,706 | 9/1982 | Chappell | 204/129.3 |

OTHER PUBLICATIONS

Applied Physics Letters 39(1), p. 76 (1981).
Infrared Physics, 6, 1 (1966), by W. N. Carr.
Patent Application Kohn et al. 5—5, Ser. No. 223,356, filed Jan. 8, 1981.

*Primary Examiner*—T. M. Tufariello
*Attorney, Agent, or Firm*—Walter G. Nilsen

[57] ABSTRACT

An etching process is described which can etch geometrical shapes on the surface of an n-type or intrinsic compound semiconductor and yield surfaces of optical quality without further processing. The etching process is an electrochemical process where etching is proportional to light intensity. The process involves applying a potential to the compound semiconductor while immersed in an electrolytic solution and irradiating the surface to be etched with light in a certain energy range. The electrolytic solution contains hydrofluoric acid. The distribution of light intensity and ray direction is selected to produce the desired geometrical shape. Particularly advantageous is that the surfaces produced are of optical quality. For example, lenses produced by the etching process exhibit surfaces of optical quality. Further, the process can be carried out on all the lenses on a wafer simultaneously without attention to individual devices. This is highly desirable economically. Also, the lenses produced are integral parts of the light emitting diode.

19 Claims, 3 Drawing Figures

ETCHING OF OPTICAL SURFACES

TECHNICAL FIELD

The invention is a process for etching geometrical shapes on a compound semiconductor yielding surfaces of optical quality.

BACKGROUND OF THE INVENTION

The development of optical communication systems, various optical devices and other optical systems has created the need for various new devices, modifications of existing devices, and processes for making such devices. A particularly important class of optical devices are those involving use of various compound semiconductors. Typical examples of such devices are light emitting diodes, optical detectors, and semiconductor lasers. Often, it is required to form various geometrical shapes on the surface of the compound semiconductor which must be of optical quality. A typical example is the formation of a lens on the surface of a light emitting diode. The lens is used to collect radiation given off isotropically inside the light emitting diode and concentrate it in a particular direction. A typical example is concentration of light from a light emitting diode into an optical fiber in an optical communication system.

In the production of many optical devices, batch processing is used where many devices are produced simultaneously on one semiconductor wafer. Typically, in the production of light emitting diodes, more than about 20 devices are made on a single wafer. Processing is carried out simultaneously on all the devices. In producing geometrical shapes of optical quality, it is highly desirable economically that it be done on all the devices simultaneously without attention to individual diodes. In other words, it is desirable to have an etching procedure which can etch precise geometrical shapes and yield surfaces of optical quality which will transmit or reflect radiation without excessive scattering.

A photoelectrochemical etching procedure for p-type gallium arsenide has been described in the literature (see *Applied Physics Letters*, 39(1), page 76 (1981)) but this procedure applies only to p-type compound semiconductors.

SUMMARY OF THE INVENTION

The invention is a process for electrochemically photoetching n-type or intrinsic compound semiconductors in an electrolytic solution in which the etched surface produced is of optical quality. The process involves applying an electrochemical potential to the compound semiconductor, which value is within a specific range determined by the particular compound semiconductor being etched and the composition of the electrolytic solution, and illuminating the surface being etched with radiation of sufficient energy to produce holes in the valence band of the compound semiconductor. The composition of the electrolytic solution is of great importance in producing optical quality etched surfaces. The electrolytic solution should be aqueous, with conductivity of at least 0.0001 mho per cm (preferably greater than 0.01 mhos per cm) and contain hydrofluoric acid. The concentration of hydrofluoric acid may vary over large limits (from 0.01 to 5 molar) but a range from 0.5 to 2 molar is preferred. Additional salts may be added to promote conductivity, buffering, etc. Preferably, a fluoride salt (KF, NaF, etc.) is used in the concentration range from 0.1 to 2 molar. The procedure is exceedingly useful in etching lenses on InGaAsP/InP light emitting diodes where the lenses are etched in the InP substrate material using a mask consisting of an array of patterns of alternating clear and opaque rings. The resulting lenses concentrate a large fraction of light given off by the light emitting diode in the direction desired and have exceedingly low scattering losses. In addition, they form an integral part of the diode structure (rather than a lens structure put onto the diode structure) and the lenses are formed simultaneously on all the diodes in the wafer without attention to individual diode structures. Such batch processing is highly advantageous economically.

DETAILED DESCRIPTION

Figure 1:
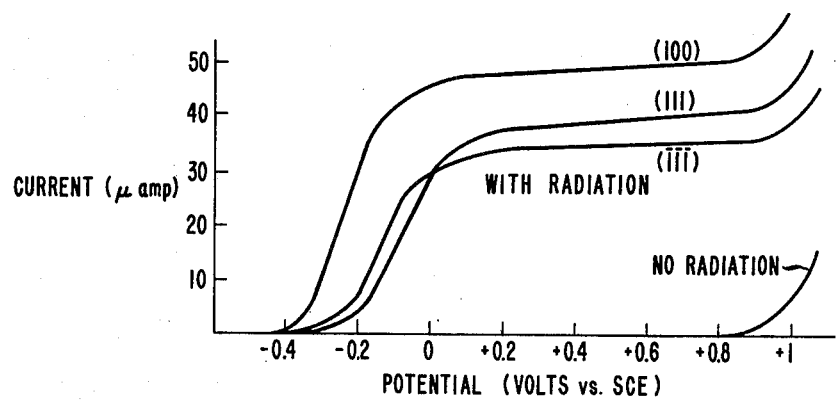
FIG. 1 shows a voltammogram of n-type InP in aqueous HF.

The invention depends on the observation that an electrochemical photoetching procedure carried out on a compound semiconductor in an electrolytic solution containing hydrofluoric acid yields surfaces of optical quality. Scattering on such surfaces from the light emitting diode is very low due to the very smooth surfaces produced. Roughness is less than about a quarter wavelength inside the light emitting diode (about 0.1 $\mu$m).

In the electrochemical photoetching process, the compound semiconductor is made part of an oxidation-reduction reaction. The compound semiconductor is made the anode and a counter-electrode (usually an inert metal such as platinum or platinized titanium) made the cathode. A potential is applied to the semiconductor, the value of which is discussed below. Etching results from a decomposition reaction induced by photogenerated holes at the interface between semiconductor and the electrolytic solution.

The process is useful for a large variety of semiconductor compounds including III–V compounds and II–VI compounds. Typical semiconductor compounds are CdS, CdSe, HgCdTe, GaP, GaAs, AlAs, AlP, AlSb, InSb, InAs, InP, GaInAs, GaInP, GaInAsP, GaAlP and GaAlAs. Both intrinsic and n-type material may be etched by the inventive process. Intrinsic semiconductors refer to a class of semiconductors where the number of holes and electrons in the absence of radiation are nearly equal (usually within a factor of 100). Intrinsic semiconductors include undoped semiconductors and compensated semiconductors (semiconductors doped with traps to compensate for impurities or other dopants). Typically, such semiconductors are semi-insulating with resistivities greater than $10^6$ ohm-cm or more usually greater than $10^7$ or $10^8$ ohm-cm. However, it should be recognized that the etching process works on intrinsic compound semiconductors with much lower resistivities. Often, such materials are useful for substrates because of their semi-insulating characteristics.

Also included are n-type compound semiconductors where electrons exceed holes. Usually, n-type semiconductors are obtained by substituting donors into the lattice (e.g., sulfur, selenium or tellurium for group V elements or silicon for group III elements in a III–V semiconductor). Typical doping levels are $10^{15}$ to $10^{19}$ atoms per cubic centimeters, with $10^{16}$ to $10^{18}$ atoms per cubic centimeters preferred for many applications. The process is useful on compound semiconductors where radiation with energy greater than the band gap of semiconductor has a significant effect on the minority carrier population. In general, this means that in the absence of light, hole carrier population should not exceed electron carrier population in the compound semiconductor by more than a factor of 100.

An electric power source (i.e., battery, electronic power supply, etc.) is used to supply power for the electrochemical reaction and apply potential to the compound semiconductor. Meters are usually used in the circuit to measure potential (usually against a saturated KCl Calomel electrode, SCE, also located in the electrolytic solution) and current. The current is proportional to the etch rate and therefore is a convenient monitor for the etching process.

The potential on the compound semiconductor to be photoetched is particularly important because too high a potential will lead to etching in the absence of radiation and too low a potential will prevent any etching even in the presence of radiation. As a general criteria, the potential should be between the maximum potential of the valence band in the particular electrochemical solution being used and the flat band potential under these same conditions. The flat band potential is approximately the conduction band minimum for n-type compound semiconductors and about halfway between valence and conduction band for intrinsic compound semiconductors. Often these various potentials are known or can be found from various literature references. Typical values for n-type InP are −0.5 volts to +1.2 volts on the SCE scale in 1.0 molar hydrofluoric acid and 0.5 molar potassium fluoride. Best results are obtained in the range from +0.2 to +0.5 with +0.3 most preferred.

Where the relevant potentials are not known or where more accurate potentials are desired, a direct measurement of these quantities can be made by taking a voltammogram of the particular compound semiconductor. Here, the rate of etching is measured (by observing the current as described above) as a function of applied potential with and without radiation incident on the surface of the compound semiconductor. It is found that in one region of potential, high etching (as evidenced by high currents) is observed with radiation but essentially no etching (near zero current) without radiation. It is this region of potential that is of interest in the electrochemical photoetching process.

A typical voltammogram is shown in FIG. 1 for n-type InP (doped with sulfur to about $10^{18}$ atoms per cubic centimeters). Measurements are shown for these crystal faces of n-type InP. These measurements were carried out in 1.0 molar HF and 0.5 molar KF. For the (100) face in the potential region from −0.5 to +1.2 volts on the SCE scale, etching is obtained with radiation but little or no etching obtained without radiation. This region of potential yields satisfactory photoetching results. Preferred is the region where the etch rate is relatively independent of potential and rapid (the plateau of the curve) but away from the potential where etching occurs (+0.2 to +0.5 volts). Radiation was supplied by a He-Ne laser with a power of about 108 microwatts. The (111) and ($\bar{1}\bar{1}\bar{1}$) faces of n-type InP yield similar results except the curve for irradiated etching is displaced to more positive potential by about 0.2 volts.

Voltammograms are also obtained for n-type GaAs in the same electrolytic solution. The potential range for photoetching was found to be −0.8 to +1.0, with −0.4 to +0.4 preferred. A value of 0.0 is usually used. For GaAlAs, the conduction band moves up about 0.4 volts but the valence band remains essentially unchanged. Thus, the etching curve with radiation moves to a more negative potential by about 0.4 volts.

Various light sources may be used provided at least part of the light source contains sufficient energy to create holes in the valence band at the surface of the compound semiconductor. This requirement is most easily met by using radiation with energy equal to or greater than the band gap of the compound semiconductor. Under some circumstances, light energy less than the band gap of the compound semiconductor may be used because of energy states in the band gap. Often, these energy states are due to impurities, doping elements, compensation elements, and crystal imperfections. However, for convenience and etching speed, radiation with energy greater than the band gap is preferred. Broad-band radiation (as from a tungsten lamp) or essentially monochromatic radiation (as from a laser) may be used. Lenses and other optical means may be used to achieve desired ray direction, concentration of radiation, etc.

For many applications, a mask is used to confine the radiation (and therefore the etching) to specific regions. Masks may also be used to vary the etching rate over some portion of the semiconductor surface by varying the light transmission over some portion of the surface. Partially reflecting or absorbing masks may be used. Often photographic emulsions are used in making such masks.

The nature of the electrolytic solution is of considerable importance in achieving optical quality surfaces. The electrolytic solution should be an aqueous acid solution containing fluoride ions (i.e., aqueous HF) with pH less than 5, preferably 3.2. Often, the solution contains a salt, preferably a fluoride salt such as KF, NaF, etc. Often, the solution is made by adding base (i.e., KOH) to an aqueous HF solution. An acid solution with a concentration of HF between 0.5 and 2 molar and optionally a salt concentration between 0.5 and 1.0 molar yields excellent results. The range of HF concentration gives reasonable etch rates without the disadvantage of excessive concentration (since the HF solution is corrosive) and the range of salt concentration gives excellent conductivity to the solution without the danger of precipitating the salt.

The invention is particularly well illustrated by a procedure for putting lenses on light emitting diodes. The lens was put on an InGaAsP/InP-type light emitting diode. The lens was put on the n-InP part of the structure.

Figure 2:
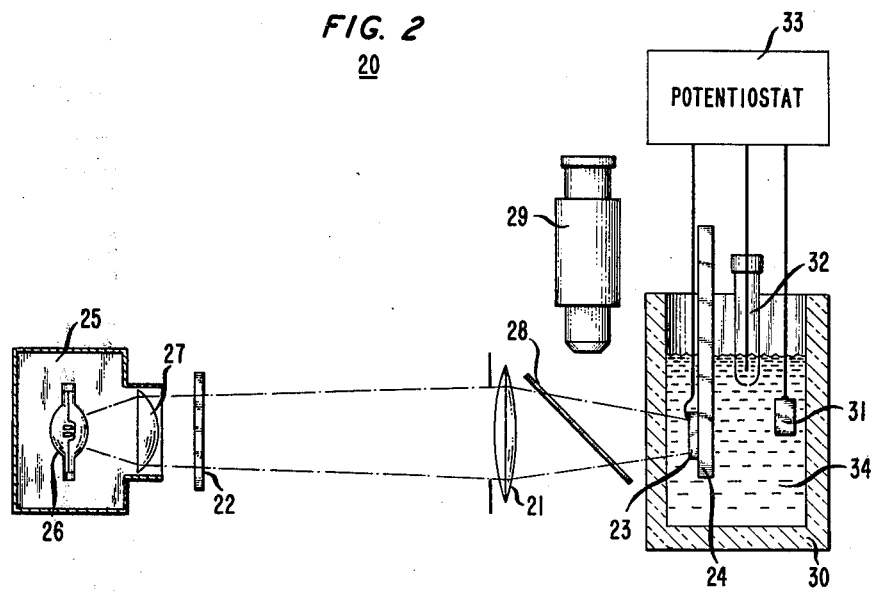
FIG. 2 shows a diagram of an apparatus useful in the practice of the invention.

The procedure was carried out on an apparatus shown in FIG. 2. This apparatus 20 is essentially a projection system in which an image of a photomask is projected onto the surface of a compound semiconductor wafer containing the individual LED devices to produce the desired light intensity pattern. In the projection system, an imaging lens 21 (a Rodenstock Apo-Rodagon 50 mm, f 2.8 apochromatic enlarging lens) is used to project the photomask 22 onto the semiconductor wafer 23 held in place by a holder 24. The mask 22 was illuminated by a projection light source 25 comprising 100 watt tungsten-halogen lamp 26, condensing system of aspheric collimating lens (inside the box but not shown) and a water filter (not shown). Also used is a lens 27 to focus the filament onto the projection lens. A pellicle beam splitter 28 between the projection lens and the cell directed reflected light from the wafer into a microscope 29 with a long working distance to permit adjustment of the mask image. The cell 30, which was made of plexiglass, was mounted on a stage that allowed 3 translational and 3 rotational degrees of freedom. The orientation and transverse position of the cell 30 were adjusted to align the wafer with respect to the mask image. The longitudinal positions of the lens 21 and the cell 30 were adjusted so that the magnification and focus were correct. The light intensity was adjusted with neutral density filters to give a current density less than 15 mA/cm². Also present in the electrochemical cell is a counter-electrode 31 made of platinum metal and a SCE reference electrode 32, the electrochemical reaction was electrically powered by a potentiostat 33.

The electrolytic solution 34 consisted of 1.5 molar HF and 0.5 molar KF (made up by adding appropriate amounts of 0.5 molar KOH to 2.0 molar HF). The potential applied to the wafer was between 0.1 and 0.4 volts on the SCE scale which yielded etch rates less than 0.5 μm per minute. Current density was less than 15 mA per cm². Under these conditions, current density was directly proportional to light intensity. Although arbitrary lens shapes can be etched, for these experiments spherical lenses were etched since their light collection properties are easily calculated for comparing the expected performance with the actual performance.

A large variety of photomasks may be used in the practice of the invention provided the spatial variation of transmission will yield the desired lens shape assuming etch rate proportional to light intensity. Emulsion masks, reflecting masks, etc., may be used. The transmission function of the mask depends on the ratio of the minimum to the maximum transmission. This ratio should be as small as possible to minimize material removal. Constraints on the spatial variation of optical density that can be practically realized limit its smallness. A value of 0.1 was chosen as a reasonable compromise. Assuming uniform illumination and the maximum transmission to be one, the equation for the transmission T of the mask as a function of the radius r from the center of the lens then becomes $$T(r) = \begin{cases} \dfrac{R - 0.1\sqrt{R^2 - \left(\dfrac{D}{2}\right)^2} - 0.9\sqrt{R^2 - M^2 r^2}}{R - \sqrt{R^2 - \left(\dfrac{D}{2}\right)^2}} & r < \dfrac{D}{2M} \\ 1 & r > \dfrac{D}{2M} \end{cases}$$

where R is the desired radius of curvature of the lens, D is the diameter of the lens, and M is the magnification with which the mask is to be projected onto the surface. This will produce the spherical lens when the region surrounding the lens is etched to a depth of $$\frac{10}{9}\left(R - \sqrt{R^2 - \left(\frac{D}{2}\right)^2}\right).$$

For 100 μm thick LEDs, a radius of curvature of 75 μm is near optimum. The diameter of the lens was chosen to be 62.5 μm to match the core diameter of typical optical fibers.

A particularly convenient mask for this application is one consisting of alternating transparent and opaque ring (rings of high and low light transmission). This type of mask eliminates errors due to the wavelength dependence of the optical density of an emulsion. Also, convenient methods are available for fabricating such a mask. The radii of the rings were chosen so that the average transmission through adjacent pairs matched the desired transmission given by the equation at the boundary between the pair. This is repeated out from the center until unit transmission is obtained.

The mask was fabricated by an Electron Beam Exposure System (EBES) which produces the pattern in a chromium coated glass plate. In calculating the ring widths the reflection of the glass ($\sim 8.0$ percent) and the finite transmission of the chromium film ($\lesssim 0.5$ percent) was neglected. The EBES system could write at 0.25 μm intervals and a reasonably clean ring width of 1.0 μm could be achieved. With this minimum ring width, the mask was designed to be projected onto the surface with a magnification M=0.5 and consisted of a 9×9 array of patterns. The magnification of 0.5 was chosen as a compromise between obtaining a smoothly varying light intensity of the LED surface from the ring pattern of the mask and being able to process as large a wafer as possible without having to step and repeat.

Figure 3:
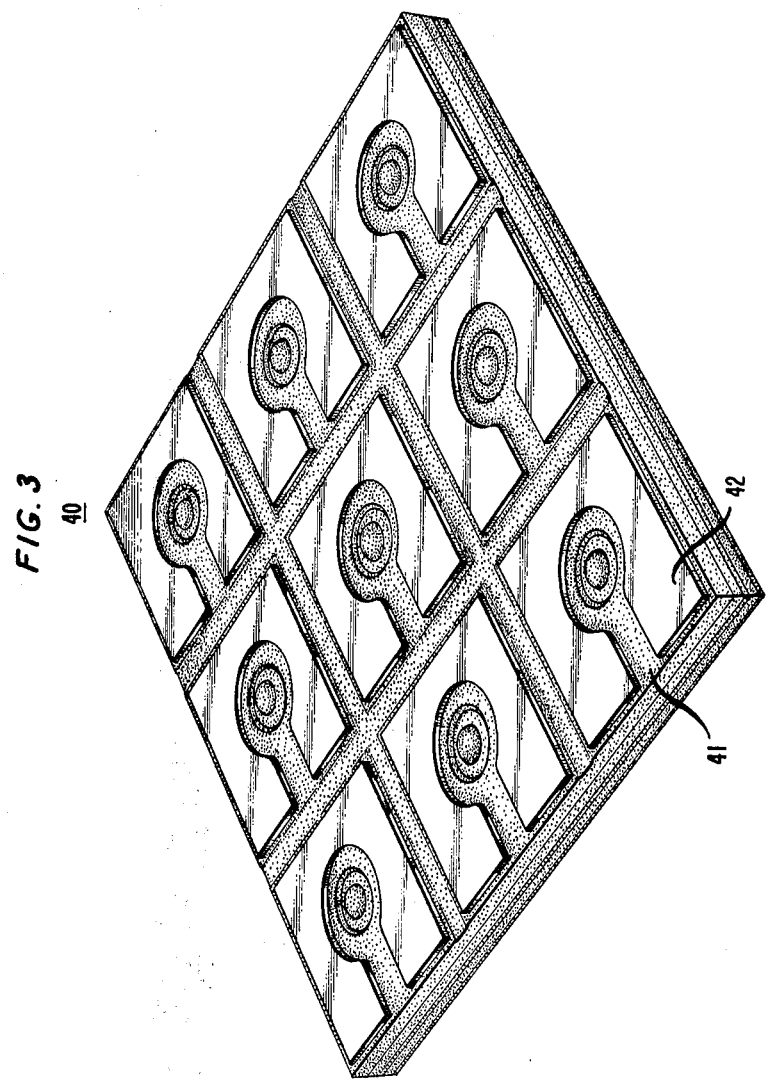
FIG. 3 shows an array of light emitting diodes with lenses produced in accordance with the invention.

The process was carried out on an array of LED devices on a wafer 40. Part of such a wafer is shown in FIG. 3. The actual layers are not of interest here except that the p-side or active is on the opposite side from where the lenses are and the lenses are put into the substrate 41 made of n-type InP. A metal layer 42 surrounds the place where the lens is to be put.

The lenses are etched on the wafer after processing is complete except for putting the heat sinks on the active or p-side. To insure that the lenses are centered opposite the p-contacts, an auxiliary photoresist step was introduced. The wafer is mounted with its p-side waxed to a glass disk. A mask for producing 150 μm diameter holes in photoresist on the n-side is aligned to the p-contacts by using an infrared microscope to observe radiation transmitted through the wafer. The lens patterns are centered in these openings. After etching the lenses, the photoresist is stripped in an oxygen plasma and the final processing steps continued. Before photoetching the lenses, it has been found to be beneficial to etch the substrate in H₂SO₄:30 percent H₂O₂:H₂O (1:1:10) for 1 min. to remove surface damage that inhibits photoetching in some regions.

The lenses were etched to a height of 7-12 μm. To achieve this, the surrounding region had to be etched to a depth of approximately 10 to 19 μm (total etch time about 20 to 40 minutes). This was consistent with a microphotometer measurement which gave a value of 0.14 for the ratio of the light intensity at the center to the surrounding region in the image of the lens spot but was greater than the value of 0.1 for which the mask was designed. This reduction in the contrast of the image could result from aberrations and scattering in the projection lens.

The power coupled into a graded index fiber from LEDs from the same wafer with and without lenses was measured. This improvement in coupled power agreed to within experimental error with calculated values for these LEDs. Typically, with a 30 μm light spot diameter, a factor of two more power was coupled with a 50 μm core diameter, 0.23 NA graded index fiber. Other type lenses can be photoetched including Weierstrass lens. Such lenses are discussed by W. N. Carr in *Infrared Physics*, 6, 1 (1966). This indicates that the scattering losses of these lenses is very small). Many other geometrical shapes may be etched using the inventive process. Such geometrical shapes including other types of lenses, flat optical surfaces as may be used for thinning layers on various optical devices and coupling ends for fibers or rods. In addition, other types of compound semiconductors may be etched. In particular, these include InGaAs, InGaAsP, GaAs, and GaAlAs.

What is claimed is:

1. A process for fabricating a device comprising at least one intrinsic or n-type compound semiconductor comprising the step of etching at least part of the compound semiconductor to produce a compound semiconductor surface of optical quality characterized in that the etching procedure is an electrochemical photoetching procedure in which electric current is passed through the compound semiconductor, electrolytic solution with conductivity greater than 0.0001 mhos/cm and cathode in which the electrochemical photoetching procedure further comprises
    a. applying a potential to the semiconducting compound which is between the maximum potential of the valence band of the semiconductor compound in the electrolytic solution and the minimum potential of the conduction band of the semiconductor compound in the electrolytic solution;
    b. illuminating the part of the surface of the compound semiconductor to be etched with radiation of sufficient energy to produce holes in the valence band; and,
    c. the electrolytic solution comprises aqueous hydrofluoric acid.

2. The process of claim 1 in which the compound semiconductor is a III-V compound semiconductor.

3. The process of claim 2 in which the compound semiconductor is selected from the group consisting of GaP, GaAs, AlAs, AlP, AlSb, InSb, InAs, InP, GaInAs, GaInP, GaInAsP, GaAlP and GaAlAs.

4. The process of claim 1 in which the compound semiconductor is a II-VI compound semiconductor.

5. The process of claim 4 in which the compound semiconductor is selected from the group consisting of CdS, CdSe, HgCdTe.

6. The process of claim 1 in which the concentration range of hydrofluoric acid is between 0.01 and 5 molar.

7. The process of claim 6 in which the concentration range of hydrofluoric acid is between 0.5 and 2 molar.

8. The process of claim 7 in which salts are added to promote conductivity.

9. The process of claim 8 in which the salt is a fluoride salt with concentration range from 0.1 to 2 molar.

10. The process of claim 1 in which the compound semiconductor is n-type InP and the potential on the SCE scale is between −0.5 and +1.2 volts.

11. The process of claim 10 in which the potential on the SCE scale is between 0.2 and 0.5 volts.

12. The process of claim 1 in which the compound semiconductor is n-type GaAs and the potential is between −0.8 and 1.0 volts.

13. The process of claim 12 in which the potential is between −0.4 and +0.4 volts.

14. The process of claim 1 in which the device is a light emitting diode.

15. The process of claim 14 in which the etching procedure produces a lens on the light emitting diode.

16. The process of claim 15 in which the etched lens is on the substrate of the light emitting diode.

17. The process of claim 15 in which the substrate is n-type InP.

18. The process of claim 14 in which a photomask is used to provide the proper spatial light intensity variation to produce the lens on the light emitting diode.

19. The process of claim 18 in which the photomask is alternating rings of high transmission and low transmission.

* * * * *